United States Patent [19]
Chien

[11] Patent Number: 5,894,238
[45] Date of Patent: *Apr. 13, 1999

[54] OUTPUT BUFFER WITH STATIC AND TRANSIENT PULL-UP AND PULL-DOWN DRIVERS

[76] Inventor: Pien Chien, 2786 Ronco Dr., San Jose, Calif. 95132

[*] Notice: This patent issued on a continued prosecution application filed under 37 CFR 1.53(d), and is subject to the twenty year patent term provisions of 35 U.S.C. 154(a)(2).

[21] Appl. No.: 08/790,365

[22] Filed: Jan. 28, 1997

[51] Int. Cl.⁶ .................................. H03K 17/16
[52] U.S. Cl. .................. 327/112; 327/310; 327/313; 327/379; 326/26; 326/27; 326/87
[58] Field of Search ............................. 327/108, 111, 327/112, 310, 313, 379, 389, 382, 391; 326/21, 26, 27, 87

[56] References Cited

U.S. PATENT DOCUMENTS

| | | | |
|---|---|---|---|
| 5,122,690 | 6/1992 | Bianchi et al. | 307/475 |
| 5,237,213 | 8/1993 | Tanoi | 307/290 |
| 5,253,205 | 10/1993 | Eaton, Jr. | 365/189.06 |
| 5,291,443 | 3/1994 | Lim | 365/189.04 |
| 5,319,258 | 6/1994 | Ruetz | 307/443 |
| 5,352,939 | 10/1994 | Hirabayashi et al. | 307/443 |
| 5,367,481 | 11/1994 | Takase et al. | 365/149 |
| 5,416,743 | 5/1995 | Allan et al. | 365/203 |
| 5,418,739 | 5/1995 | Takasugi | 365/149 |
| 5,426,376 | 6/1995 | Wong et al. | 326/27 |
| 5,517,142 | 5/1996 | Jang et al. | 327/108 |

*Primary Examiner*—Tim Callahan
*Assistant Examiner*—An T. Luu
*Attorney, Agent, or Firm*—Claude A. S. Hamrick; Oppenheimer W. Donnelly; Chien-Wei Chris Chou

[57] ABSTRACT

An output driver for high speed integrated circuits includes a static driver portion and a transient driver portion. The static driver size can be adjusted to satisfy the minimal requirements for maintaining output DC voltage levels. The transient drivers include a feed-back control from the output voltage node. During a transition, the transient buffer control will sense the output level and feedback to turn off the transient driver whenever the output level rises/falls across the trip point. Accordingly the di/dt noise will drop quickly once the output has reached the trip point. The transient drivers can be larger to speed up switching speed. The buffer can use single power and ground pins or multiple power/ground pins.

15 Claims, 3 Drawing Sheets

5,894,238

1

OUTPUT BUFFER WITH STATIC AND TRANSIENT PULL-UP AND PULL-DOWN DRIVERS

BACKGROUND OF THE INVENTION

This invention relates generally to an output buffer circuit for driving an output line in response to "high" and "low" control signals and, more particularly, the invention relates to a high speed driver circuit with improved noise characteristics.

In digital electronic circuits, buffers are utilized to maintain voltages on output lines at a low level (e.g. ground), or a high level (e.g. $V_{cc}$) and to change the voltage levels in response to control signals. During the transition of voltage levels, the rapidly changing current, di/dt, creates noise in the output line. Further, the ground bounce can create a ringing effect during voltage transition.

SUMMARY OF THE INVENTION

In accordance with the present invention, an output buffer includes static and transient driver circuits which facilitate rapid voltage transition but minimize noise effects during voltage transition on an output line.

The static driver has a size which is sufficient for maintaining output DC voltage levels, while the transient driver has a larger size to facilitate rapid voltage and current transitions. Control circuitry is provided to activate the transient driver at the beginning of an output voltage transition and to turn off the transient driver when the output voltage rises or falls across a trip point. More particularly, a static driver includes a pull-up transistor connecting the output line to a high voltage level, $V_{cc}$, a pull-down transistor connecting the output line to a low voltage level, ground. The two transistors are selectively activated by output high and output low control signals. The transient driver includes a pull-up transistor also connecting the output line to a high voltage level and a pull-down transistor connecting the output line to a low voltage level. The high and low voltage levels can be the same or different for the transient driver and the static driver. The transient driver transistors are preferably larger than the static driver transistors which facilitates large currents during output voltage transitions.

The transient driver transistors are selectively controlled whereby the transistors are activated at the beginning of an output voltage transition and deactivated when the output voltage rises or falls across a trip voltage level prior to reaching a steady state level. Thus, change in transient current (di/dt) is reduced as the static output voltage level is approached thereby reducing output voltage overshoot and resulting ringing and noise in the output line.

The invention and objects and features thereof will be more readily apparent from the following detailed description and appended claims when taken with the drawings.

2

Figure 5:
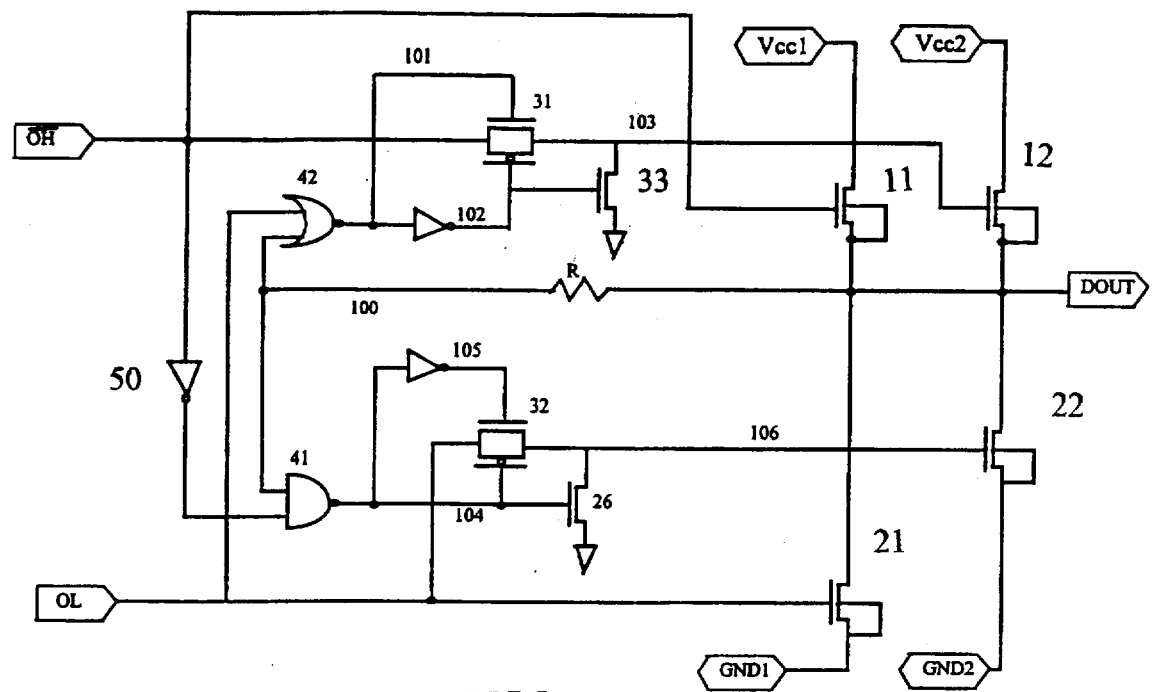

FIG. 5 is a schematic of an output buffer circuit in accordance with another embodiment of the invention.

Figure 4:
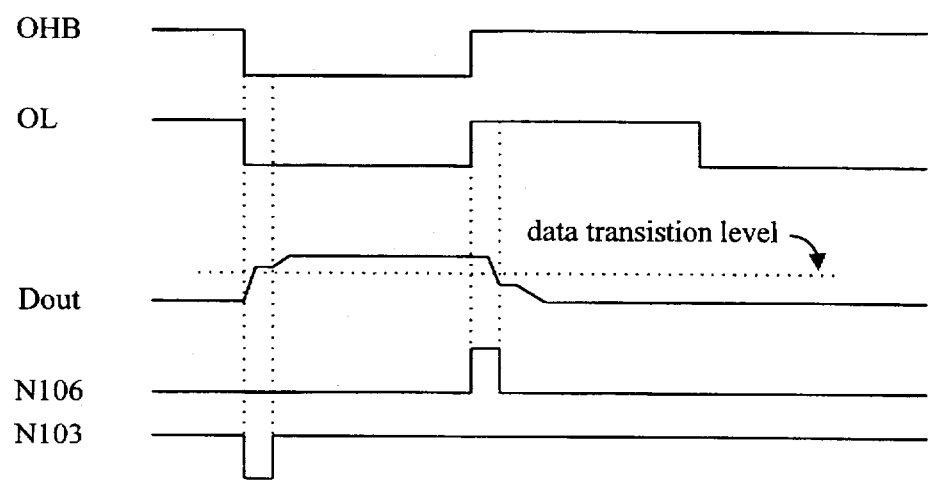
FIG. 4 is a graph illustrating voltages in the output buffer circuit of FIG. 3.
Figure 6:
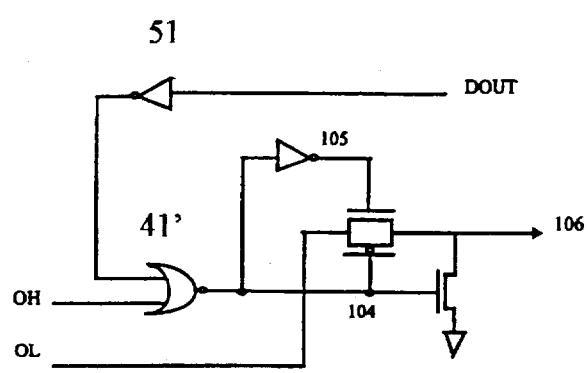

FIG. 6 is a schematic of alternative control circuitry for the transient driver of FIG. 4.

DETAILED DESCRIPTION OF THE PREFERRED EMBODIMENTS

Figure 1:
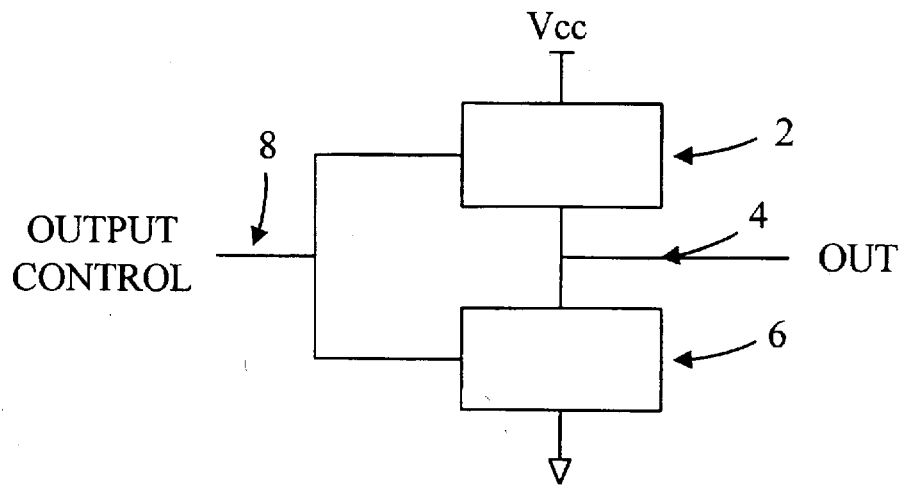
FIG. 1 is a functional block diagram of an output buffer including pull-up and pull-down drivers.

FIG. 1 is a functional block diagram of an output buffer circuit in accordance with the prior art. The buffer includes a pull-up driver 2 which serially connects an output line 4 to a high voltage level $V_{cc}$. A pull-down driver 6 serially connects the output line 4 to a low voltage level or ground. The pull-up driver 2 and pull-down driver 6 are selectively controlled by output control signals applied on line 8 to control elements of the pull-up and pull-down drivers.

Figure 2:
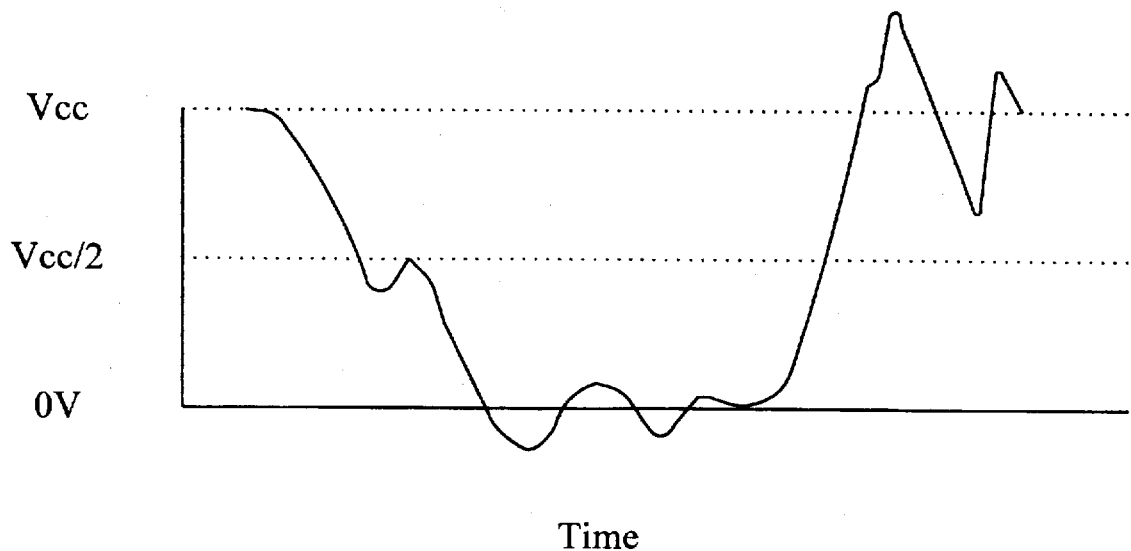
FIG. 2 is a graph illustrating output voltage during pull-up and pull-down transitions.

FIG. 2 is a plot illustrating voltages during transitions on the output line 4 in FIG. 1. When the buffer transitions from a high voltage level, $V_{cc}$, the voltage on the output line typically overshoots the low voltage level, ground, as illustrated by the voltage decreasing below zero volts and thereafter oscillating about zero volts until a steady state is reached. Similarly, when the output line is pulled up from zero volts to $V_{cc}$, the voltage on the output line 4 will overshoot $V_{cc}$ and then oscillate around $V_{cc}$ until a steady state is reached. These overshoots of the output voltage in response to transitions creates noise and possible glitches in the operation of logic circuitry connected to the output line.

Figure 3:
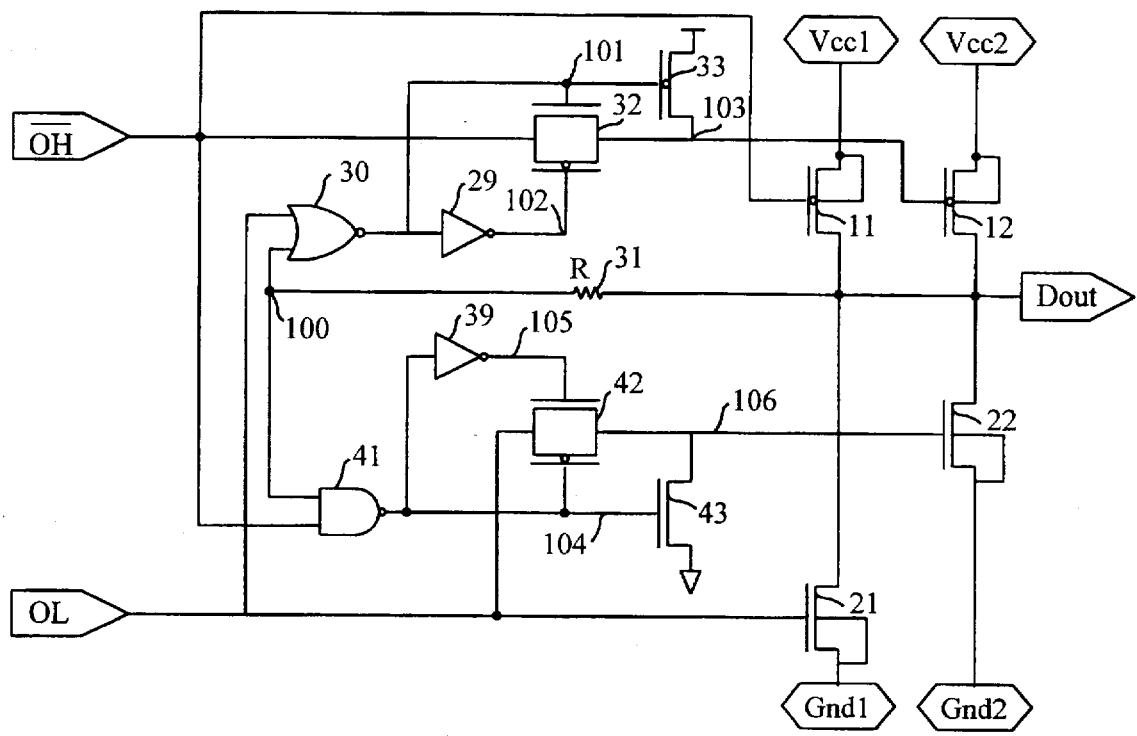
FIG. 3 is a schematic of an output buffer circuit in accordance with one embodiment of the invention.

FIG. 3 is a schematic of an output buffer circuit in accordance with one embodiment of the present invention which reduces ground bounce and voltage overshoots during voltage transitions on an output line. The buffer includes a first or static pull-up driver transistor 11 which connects the output line, DOUT, to $V_{cc}1$ and a second pull-up driver or transient driver 12 which connects DOUT to a second high voltage, $V_{cc}2$. The voltages $V_{cc}1$ and $V_{cc}2$ can be the same voltage or different voltage levels. The buffer circuit further includes a first pull-down or static driver transistor 21 which connects DOUT to ground and a second pull-down transient transistor 22 which connects DOUT to ground. Preferably, the electrical characteristics including current capacity of the transient transistors 12 and 22 are greater than the electrical characteristics of the static transistors 11 and 21, which need only be large enough to maintain a steady state voltage level on the output line. The pull-up and pull-down transistors operate in response to output control signals such as output high bar (OHB) and output low (OL). The gates of transistors 11 and 21 are directly connected to the OHB and OL lines, respectively, whereby either transistor 11 or transistor 21 is in a conducting state depending on whether the output line is to be at $V_{cc}$ or at ground. During a transition from a low voltage level to a high voltage level, control circuitry is provided for rendering transient pull-up transistor 12 conductive when OHB transitions to low state and then becomes non-conductive when the voltage on the output line reaches a trip level. Similarly, when the output line transitions from a high voltage level to a low voltage level, the OL control signal renders transistor 21 conductive and control circuitry momentarily renders transient pull-down driver 22 conductive until the voltage on the output line reaches a trip level.

The control circuitry for transient pull-up transistor 12 includes a NOR gate 30 having one input connected through resistor 31 to the output line, and a second input connected to the OL control line. The output of NOR gate 30 is connected directly and through inverter 29 to control the conduction of a transmission gate 32, which connects the OHB line to the control terminal for transient pull-up driver transistor 12. Assuming that the output line transitions from a low level to a high level, transmission gate 32 momentarily applies OHB to the gate of transistor 12 until the voltage from the output line through resistor 31 reaches a "1" level and the output of NOR gate 30 transitions from a "1" to a "0", whereupon transmission gate 32 is rendered non-conductive. Transistor 33 becomes conductive and deactivates the transient pull-up transistor 12. Thus, the feedback from the output line through resistor 31 provides for momentary conduction of the transient pull-up transistor until the input to NOR gate 30 causes the gate output to transition. Similarly, when the voltage on the output line is high, and a transition to a low level is signaled by the control signals OHB and OL, static pull-up transistor 11 is turned off and the static pull-down transistor 21 along with the transient pull-down transistor 22 are turned on, thereby pulling the output voltage towards a ground potential. The OHB signal is applied to one input of NAND gate 41 and the voltage on the output line is applied as a feedback through resistor 31 as an input to a second input to NAND gate 41. The output of NAND gate 41 controls a second transmission gate 42, using inverter 39. When the output of NAND gate 41 transitions from a "0" to a "1", transmission gate 42 is deactivated and a pull-down transistor 43 connects the control terminal of the transient pull-down transistor 22 to ground thereby turning transistor 22 off.

With reference to the plot of FIG. 4 of voltages in the circuit of FIG. 3, when there is a data transition from low to high, both OHB and OL change from high to low. Transistor 11 turns on and transistor 21 turns off. Initially, the OUT is charged up by transistor 11, but is still below a trip voltage point. Feedback from DOUT through resistor 31 keeps node 100 low for a short period of time, hence changes node 101 (102) from low (high) to high (low). Transmission gate 32 is conducting and passes OHB to the gate of transient pull-up transistor 12. After the DOUT node is charged up to a designated level, which is determined by the trip point of NOR gate 30, the output of NOR gate 30 will become high by the charging of node 100. The transmission gate 32 is turned off again and transistor 13 is turned on and the high voltage applied therethrough to the gate of transistor 12 turns the transistor off leaving only the static pull-up transistor 11 to maintain the high level on the output DOUT.

The current change with respect to time is higher at the beginning due to the on state of both pull-up transistors 11 and 12. After the output the DOUT is charged high enough, the current becomes very small with only transistor 11 staying on, thereby reducing the di/dt noise and ringing. The NAND gate 41 is disabled during the transition since OHB changes to low. Therefore, the transmission gate 42 is off and the OL signal cannot be applied to pull-down transistor 22.

Assume that DOUT changes back from high to low, as illustrated in FIG. 4. OHB and OL change from low to high. OL turns on static pull-down transistor 21 while OHB turns off pull-up transistor 11. At the beginning of this transition, DOUT is high. Node 104 becomes low, node 105 becomes high, and transmission gate 42 is turned on, resulting in passing of OL to the gate of transient pull-down transistor 22 while transistor 23 is off. After the DOUT level goes low enough, which is determined by the trip point of the NAND gate 41, node 100 disables NAND gate 41, node 104 becomes high, node 105 becomes low, shutting off transmission gate 42. Node 104 also turns on transistor 43 resulting in applying ground to the control electrode of transistor 22 which turns transistor 22 off.

FIG. 5 is a circuit similar to the circuit of FIG. 3, but in which n-channel transistors are used for both the pull-up and pull-down drivers rather than p-channel transistors for the pull-up drivers 11, 21 in FIG. 3. Inverter 50 is added in the circuit and transistor 33 connects the gate of transistor 12 to ground rather than to $V_{cc}$. All other elements remain the same and the same reference numerals as in FIG. 3 are used in FIG. 5.

FIG. 6 shows an alternative embodiment for the control circuitry for the transient pull-down transistor 22 in which NAND gate 41 is replaced by a NOR gate 41' and inverter 51 is included in the circuit.

The output buffer circuit in accordance with the invention reduces noise and ground bounce since the di/dt induced power/ground bounce is reduced after the output voltage reaches its crosspoint. Unlike conventional output buffers with slew rate control logic, the output buffer in accordance with the invention does not slow down the driver turn on speed until the output has switched to a predefined trip point of the control gates. The buffer circuit can be used for synchronous or asynchronous applications and can be used with integrated circuit chips with single or multiple power/ground pins. If multiple power/ground pins are used, which is common in today's circuits, the static and transient drivers can be applied with different power/ground bus pins. When the transient pull-up (pull-down) devices are turned off after DOUT reaches the desired value, the power/ground for the transient pull-up/pull-down devices are disconnected from DOUT. When the buffer circuit is applied to conventional wide bus low voltage output drivers, the transient power supply $V_{cc}2$ is hooked to the chip $V_{cc}$ and the static power supply $V_{cc}1$ is hooked to $V_{cc}Q$. With $V_{cc}Q$ smaller than $V_{cc}$ in general, it takes longer to charge the output. However, the buffer circuit in accordance with the invention can use $V_{cc}$ through the transient pull-up transistor 12 to charge the output at faster rate. This enhances switching speed and yet reduces di/dt after the DOUT voltage reaches a desired value.

While the invention has been described with reference to specific embodiments, the description is illustrative of the invention and is not to be construed as limiting the invention. Various modifications and applications may occur to those skilled in the art without departing from the true spirit and scope of the invention as defined by the appended claims.

I claim:

1. An output buffer circuit for driving an output line to develop an output voltage thereon in response to high and low control signals, said output buffer comprising:

a static driver circuit for alternately connecting said output line either to a high voltage source or to a low voltage source in response to output control signals, said static driver circuit having sufficient electrical capacity for maintaining a static voltage level on said output line;

a transient driver circuit for alternately connecting said output line to a high voltage source or to a low voltage source in response to transient control signals; and a driver control circuit for generating said transient control signals and said output control signals whereby said transient driver circuit and said static driver circuit are both activated at the beginning of transition of said output voltage and said transient driver circuit is deactivated said before output voltage reaches a steady state level, and whereby current drawn by said static and transient driver circuits is varied at a first rate while said transient driver circuit and said static driver circuit are both activated, and at a second rate after said deactivation of said transient driver circuit, said first rate being greater than said second rate so that noise and ringing are reduced on said output line as said output voltage approaches said steady state level.

2. The output buffer as defined by claim 1, wherein said static driver circuit and said transient driver circuit are connected to the same high voltage source and low voltage source.

3. An output buffer as defined by claim 1, wherein said static driver circuit and said transient driver circuit are connected to different high voltage sources and low voltage sources.

4. An output buffer as defined by claim 1 wherein each of said static driver circuit and said transient driver circuit includes a pull-up circuit connecting said output line to a high voltage source and a pull-down circuit connecting said output line to a low voltage source.

5. The output buffer as defined by claim 4, wherein each pull-up circuit and each pull-down circuit includes a transistor having a control electrode for controlling conduction of the transistor.

6. The output buffer as defined by claim 5, wherein each transistor comprises a field effect transistor.

7. The output buffer as defined by claim 5, wherein said driver control circuit includes a first control gate having one input from the output line and one of said output control signals as another input for controlling a trip point for said transient pull-up circuit.

8. The output buffer as defined by claim 7, wherein said driver control circuit further includes a first transmission gate controlled by the output of said first control gate, said first transmission gate applying a control signal to the transient pull up circuit until deactivated by the output of said first control gate.

9. The output buffer as defined by claim 8, wherein said driver control circuit further includes a second control gate having one input from the output line and one of said output control signals as another input for controlling a trip point for said transient pull-down circuit.

10. The output buffer as defined by claim 9, wherein said driver control circuit further includes a second transmission gate controlled by the output of said second control gate, said second transmission gate applying a control signal to the transient pull-down circuit until deactivated by the output of said second control gate.

11. An output buffer circuit for driving an output line in response to high and low control signals, said output buffer comprising:

a static driver circuit for alternately connecting said output line to a first high voltage source or to a first low voltage source in response to output control signals, said static driver circuit having sufficient electrical capacity for maintaining a static voltage level on said output line;

a transient driver circuit for alternately connecting said output line to a second high voltage source or to a second low voltage source in response to transient control signals; and a driver control circuit for generating said transient control signals and said output control signals whereby said transient driver circuit and said static driver circuit are both activated at the beginning of an output voltage transition, and said transient driver circuit is deactivated before output voltage reaches a steady state level, and whereby current drawn by said static and transient driver circuits is varied at a first rate while said transient driver circuit and said static driver circuit are both activated, and at a second rate after said deactivation of said transient driver circuit, said first rate being greater than said second rate so that noise and ringing are reduced on said output line as said output voltage approaches said steady state level.

12. An output buffer circuit as recited in claim 11 wherein:

said static driver circuit includes a static pull-up transistor for connecting said output line to said first high voltage source, and a static pull-down transistor for connecting said output line to said first low voltage source; and said transient driver circuit includes a transient pull-up transistor for connecting said output line to said second high voltage source, and a transient pull-down transistor for connecting said output line to said second low voltage source.

13. An output buffer circuit as recited in claim 12 wherein:

said transient pull-up transistor has a current capacity larger than the current capacity of said static pull-up transistor; and said transient pull-down transistor has a current capacity larger than the current capacity of said static pull-down transistor.

14. An output buffer circuit as recited in claim 11 wherein said first high voltage source is the same as said second high voltage source, and wherein said first low voltage source is the same as said second low voltage source.

15. An output buffer circuit as recited in claim 11 wherein said first high voltage source is not equal to said second high voltage source, and wherein said first low voltage source is not equal to said second low voltage source.

* * * * *